United States Patent [19]
Suzuki et al.

[11] Patent Number: 6,116,490
[45] Date of Patent: Sep. 12, 2000

[54] BONDING APPARATUS

[75] Inventors: Yasushi Suzuki, Oume; Hiroto Urubayashi, Musashimurayama, both of Japan

[73] Assignee: Kabushiki Kaisha Shinkawa, Tokyo, Japan

[21] Appl. No.: 09/118,585

[22] Filed: Jul. 17, 1998

[30] Foreign Application Priority Data

Jul. 29, 1997 [JP] Japan ................................ 9-216946

[51] Int. Cl.[7] .......................... B23K 20/10; H01L 21/607
[52] U.S. Cl. ............................................. 228/1.1; 28/110.1
[58] Field of Search ................................ 228/102, 110.1, 228/111, 1.1, 8

[56] References Cited

U.S. PATENT DOCUMENTS

| 4,466,565 | 8/1984 | Miyazima | 228/1.1 |
| 5,494,207 | 2/1996 | Asanasavest | 228/110.1 |

FOREIGN PATENT DOCUMENTS

| 58-161334 | 9/1983 | Japan . |
| 62-249437 | 10/1987 | Japan . |
| 63-239834 | 5/1988 | Japan . |
| 2530224 | 4/1996 | Japan . |
| 2565009 | 12/1996 | Japan . |

*Primary Examiner*—Samuel M. Heinrich
*Attorney, Agent, or Firm*—Koda & Androlia

[57] ABSTRACT

A bonding apparatus such as a die bonding apparatus in which a bonding tool at one end of an ultrasonic horn is given a vibration, the bonding apparatus being equipped with a Y-direction driver which has a Y-direction piezo-electric element that causes the bonding tool to vibrate in a Y-direction which is parallel to an axis of the ultrasonic horn, and an X-direction driver which has an X-direction piezo-electric element that causes the bonding tool to vibrate in an X direction which is on a plane perpendicular to the Y-direction, so that the piezo-electric elements are driven during bonding so that the bonding tool vibrates in the X- and Y-directions on the bonding plane.

4 Claims, 4 Drawing Sheets

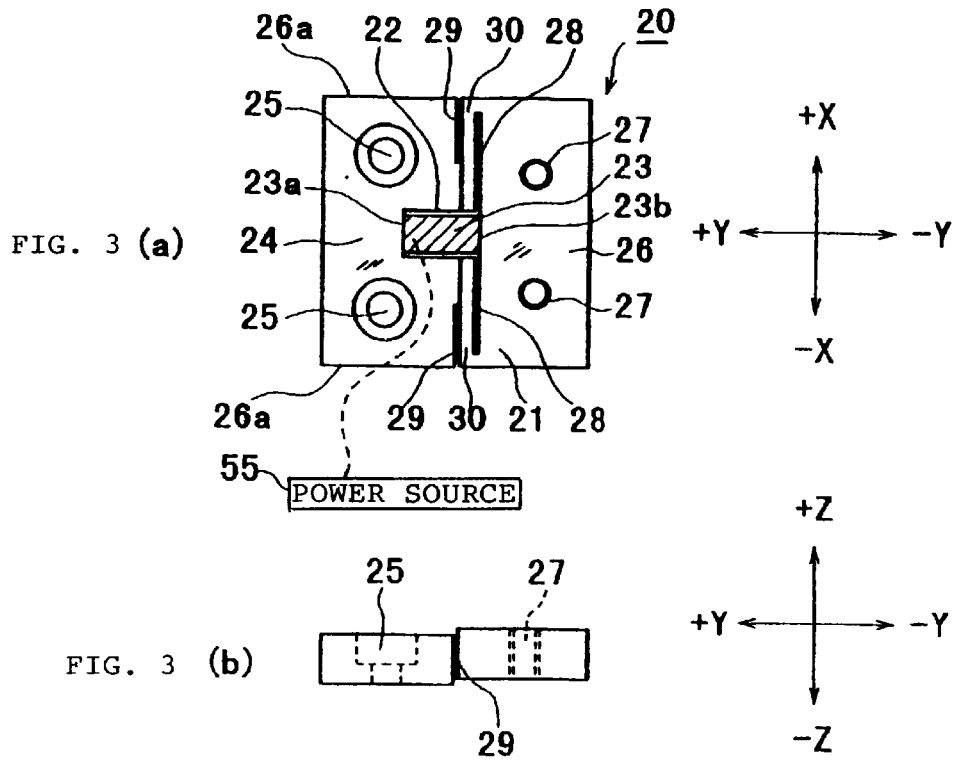
FIG. 3 (a)
FIG. 3 (b)
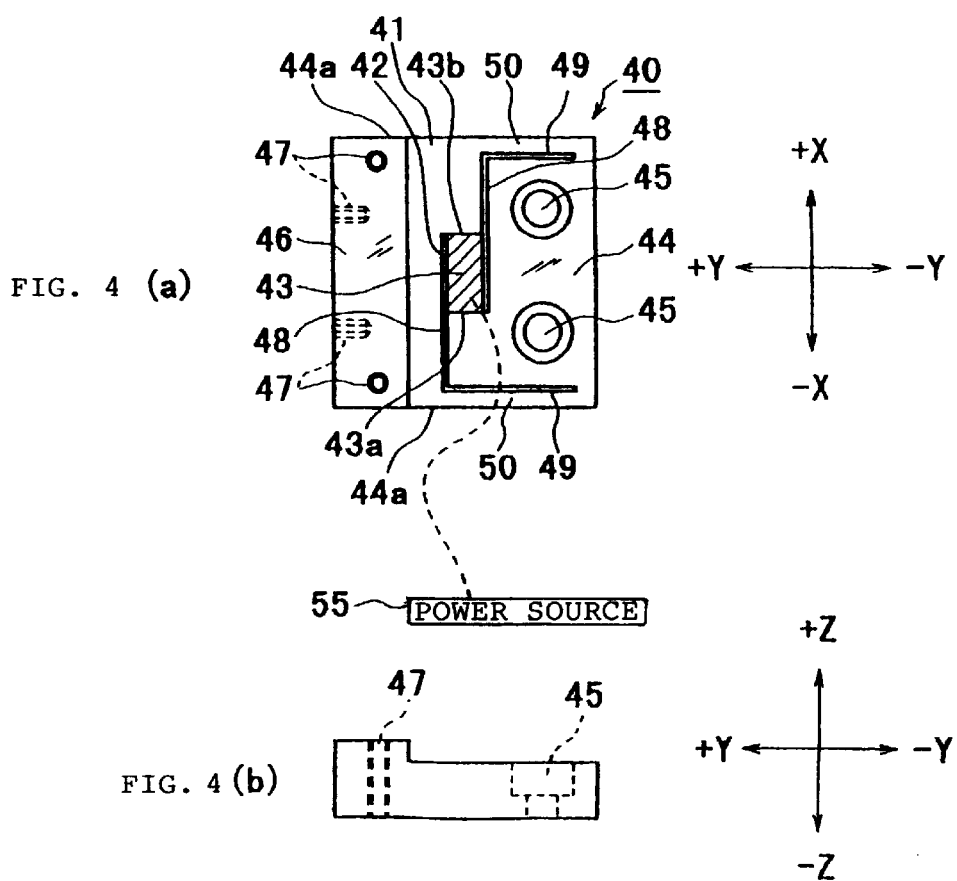
FIG. 4 (a)
FIG. 4 (b)

BONDING APPARATUS

BACKGROUND OF THE INVENTION

1. Field of the Invention

The present invention relates to a bonding apparatus such as a wire bonding apparatus, die bonding apparatus, etc.

2. Prior Art

Conventionally, bonding apparatuses in which a vibration is applied to the bonding tool during bonding have been classified into three main types as described below.

In the first type, an XY table installed in the bonding apparatus is vibrated so that a scrubbing action is performed. This type of bonding apparatus is disclosed in Japanese Patent Nos. 2530224 and 2565009.

In the second type, a scrubbing action and an ultrasonic vibration for bonding are combined using a single piezo-electric element. This type of bonding apparatus is disclosed in Japanese Patent Application Laid-Open (Kokai) Nos. S62-249437 and S63-239834.

In the third type of apparatus, a plurality of ultrasonic oscillating elements are provided, and bonding is performed by applying ultrasound using a combination of vibration of the oscillation elements. For example, a bonding apparatus of this type is disclosed in Japanese Patent Application Laid-Open (Kokai) No. S58-161334.

In the case of the scrubbing action performed by means of an XY table in the above-described first type of apparatus, the large-mass XY table and the bonding head as a whole are moved. Accordingly, vibration of the apparatus as a whole causes a fluctuation in the bonding load, and precise control of the amplitude and frequency of the scrubbing action is difficult. These and other factors hinder a stable bonding operation.

In systems of the second type described above in which ultrasonic vibration and a scrubbing action are combined by the use of a single piezo-electric element, there is a large difference between the ultrasonic oscillation and the scrubbing action in terms of the amplitude required. Accordingly, if a piezo-electric element which is suitable for the ultrasonic oscillation is used, the amount of displacement is too small for the scrubbing action. In the case of a multiple laminated type piezo-electric element in which the amount of displacement is large, the internal loss is large, and a large loss results when such an element is used for ultrasonic oscillation. Furthermore, as the number of laminated layers increases, i. e., as the amount of displacement is increased, the resonance frequency of the piezo-electric element decreases, so that the piezo-electric element becomes unsuitable for ultrasonic oscillation.

In systems of the above described third type which have a plurality of ultrasonic oscillating elements, a scrubbing action is not performed, and the following problems arise:

In particular, the amplitude of the ultrasonic oscillation gradually increases from an extremely small value, and the increase in amplitude per cycle of vibration is extremely small. For example, assuming that the ultrasonic waves rise up to 1 micron in 0.5 ms; then if the frequency is 60 Khz, the increase in amplitude is 1/30 micron per stroke, because there are approximately 30 amplitude before rising up to one micron. When the wire is pressed against the bonding surface by the bonding tool, the surface of the wire that contacts the bending surface bites into projections, forming indentations on the bonding surface. When ultrasound is applied in this state, the portion of the surface of the wire where the projections and indentations are bitten into at the first amplitude (peak) is plastically deformed only by an amount that corresponds to a small amplitude. Since the amplitude gradually increases from this state in each cycle; the deformation of the wire surface spreads by an extremely small increment in amplitude in each cycle.

Thus, even if the amplitude reaches a maximum while the deformation gradually spreads, the amount of movement by which the surface of the wire attempts to destroy the oxide film on the bonding surface is only this extremely small increment of one cycle; accordingly, the oxide film on the bonding surface merely undergoes elastic deformation, and this action is insufficient to destroy the oxide film.

In the case of scrubbing, on the other hand, the stroke of the first amplitude (peak) is much larger than in the case of ultrasonic oscillation and is therefore sufficient to destroy the oxide film so that bonding is made possible. Such superiority of the scrubbing action is due not only to the fact that the amplitude is several times that of scrubbing effected by ultrasonic oscillation, but also due to the fact that the initial distance of movement of the amplitude is completely different.

SUMMARY OF THE INVENTION

Accordingly, the object of the present invention is to provide a bonding apparatus in which vibration during the scrubbing action is reduced so that a stable bonding operation is performed, and in which the timing and direction of the scrubbing action which are optimal for the workpiece involved can be freely selected.

The first means of the present invention that accomplishes the object is characterized in that in a bonding apparatus equipped with an ultrasonic horn which has a bonding tool attached to one end thereof, a plurality of piezo-electric elements are provided so that the piezo-electric elements respectively cause the bonding tool to vibrate in arbitrary directions on the bonding plane during bonding.

The second means of the present invention that accomplishes the object is characterized in that in the bonding apparatus described above, the piezo-electric elements comprises a Y-direction piezo-electric element, which causes the bonding tool to vibrate in the Y direction parallel to the axis of the ultrasonic horn, and an X-direction piezo-electric element, which causes the bonding tool to vibrate in the X-direction which is on a horizontal plane perpendicular to the Y direction.

The third means of the present invention that accomplishes the object is characterized in that in a bonding apparatus equipped with an ultrasonic horn which has a bonding tool attached to one end thereof, the bonding apparatus is further comprised of a Y-direction driving means which has a Y-direction piezo-electric element that causes the bonding tool to vibrate in a Y direction parallel to the axis of the ultrasonic horn, and an X-direction driving means which has an X-direction piezo-electric element that causes the bonding tool to vibrate in an X direction which is on the horizontal plane perpendicular to the Y direction, wherein the piezo-electric elements are driven during bonding so that the bonding tool is caused to vibrate in the X and Y directions on the bonding plane.

The fourth means of the present invention that accomplishes the object is characterized in that in a bonding apparatus equipped with an ultrasonic horn which has a bonding tool attached to one end thereof, the bonding apparatus is further comprised of an XY-direction driving means that includes a Y-direction piezo-electric element, which causes the bonding tool to vibrate in the Y direction parallel to an axis of the ultrasonic horn, and an X-direction piezo-electric element, which causes the bonding tool to vibrate in an X direction which is on the horizontal plane perpendicular to the Y direction, wherein the piezo-electric elements are driven during bonding so that the bonding tool is caused to vibrate in the X and Y directions on the bonding plane.

BRIEF DESCRIPTION OF THE DRAWINGS

FIG. 3(a) is a plan view of the Y-direction driving means used in the apparatus of FIG. 1, and FIG. 3(b) is a side view thereof;

FIG. 4(a) is a plan view of the X-direction driving means used in the apparatus of FIG. 1, and FIG. 4(b) is a side view thereof;

DETAILED DESCRIPTION OF THE INVENTION

One embodiment of the present invention will be described with reference to FIGS. 1 through 5.

Figure 1:
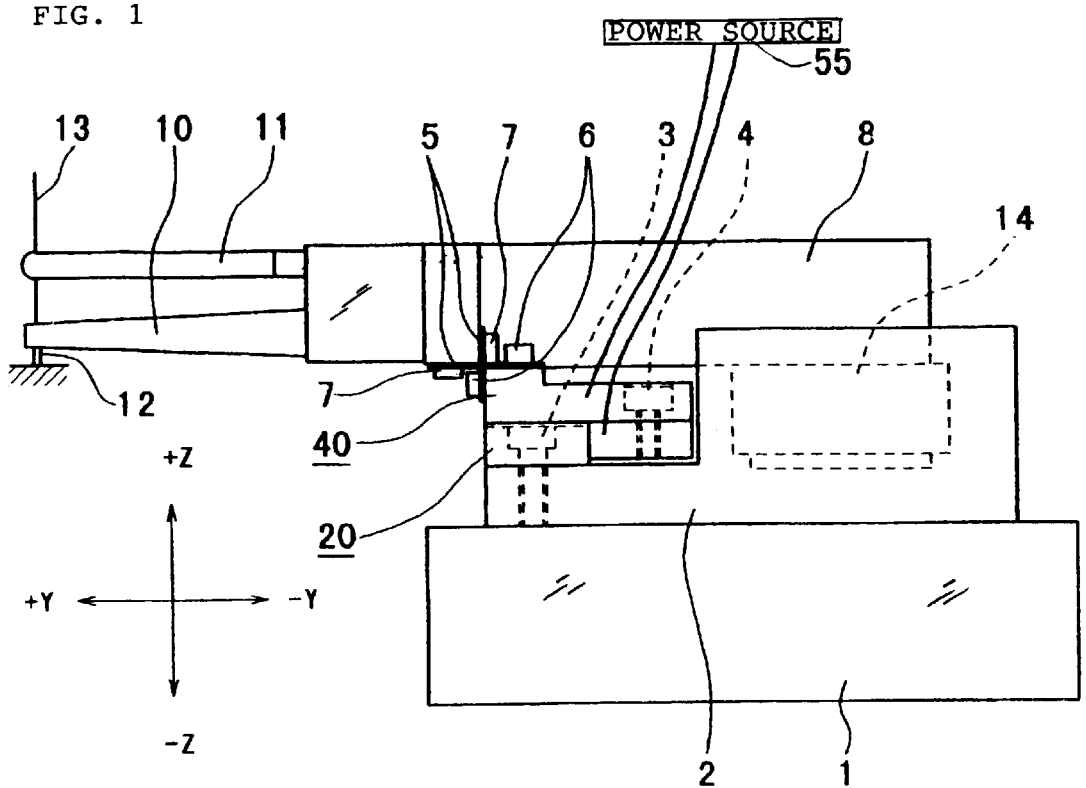
FIG. 1 is a side view which illustrates one embodiment of the bonding apparatus of the present invention.
Figure 2:
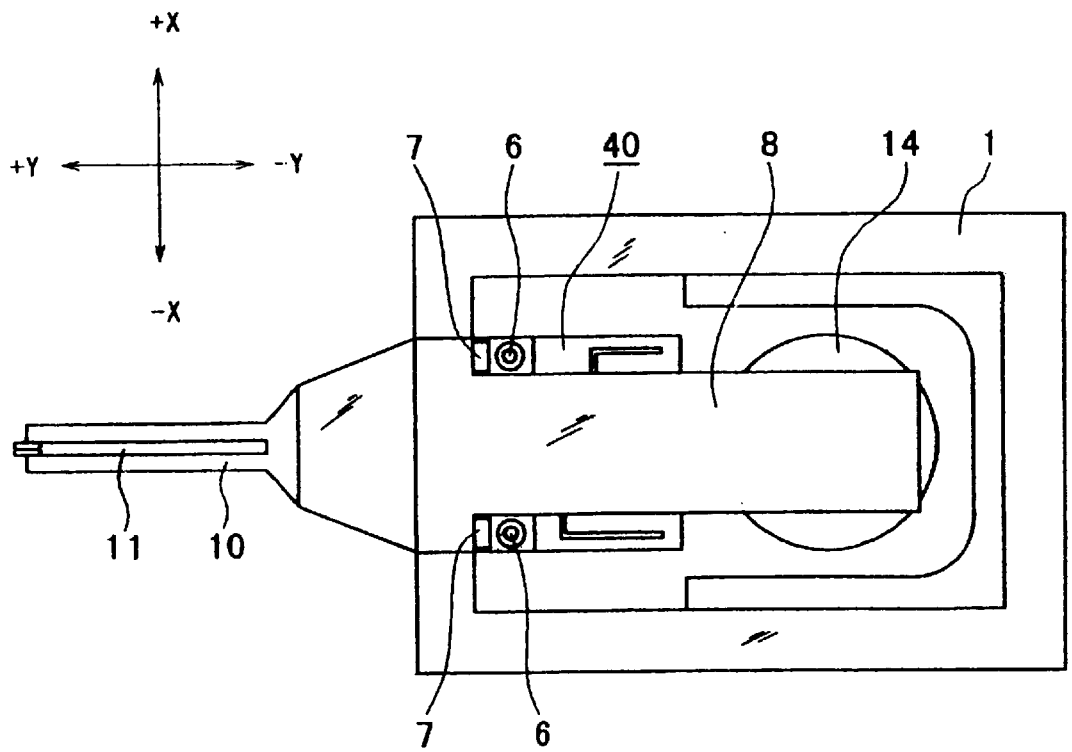
FIG. 2 is a plan view of FIG. 1.

As shown in FIGS. 1 and 2, a bonding head 2 is mounted on an XY table 1 which is driven in the X and Y directions on the horizontal plane. A Y-direction driving means 20 (details of which will be described later) is fastened to the bonding head 2 by means of bolts 3, and an X-direction driving means 40 (details of which will be described later) is fastened to the Y-direction driving means 20 by means of bolts 4. Plate springs 5 which are installed in a cruciform configuration are fastened to the front end portion of the X-direction driving means 40 by means of bolts 6 and are further fastened to a bonding arm 8 by means of bolts 7. Accordingly, the bonding arm 8 is swingable about the plate springs 5. Here, the Y direction is the direction parallel to the axis of the ultrasonic horn 10 (which will be described later), and the X direction is the direction on the horizontal plane that is perpendicular to the Y direction.

An ultrasonic horn 10, which contains an ultrasonic vibration source, and a wire clamper 11 are provided on the bonding arm 8, and a bonding tool 12 is attached to the tip end portion of the ultrasonic horn 10. A wire 13 which is wound on a wire spool (not shown) is passed through the wire damper 11 and passed through the bonding tool 12. Moreover, the rear end portion of the bonding arm 8 is connected to the bonding head 2 with a linear motor 14 in between.

The Y-direction driving means 20 is structured as shown in FIG. 3.

In particular, the Y-direction driving means 20 comprises a Y-direction driving plate 21, and a rectangular attachment hole 22 in which an piezo-electric element 23 is installed is formed more or less in the center of the Y-direction driving plate 21; and in addition, the left end portion 23a of a piezo-electric element 23, which is installed so that the direction of expansion and contraction thereof is oriented in the Y direction, is fastened to this rectangular attachment hole 22. The left side (in FIG. 3(a)) of the Y-direction driving plate 21 constitutes a bonding head fastening part 24, and bolt insertion holes 25 into which the bolts 3 are inserted are formed in this bonding head fastening part 24. The right side (in FIG. 3(a)) of the Y-direction driving plate 21 constitutes an X-direction driving plate fastening part 26, and two screws 27 with which the bolts 4 are screw-engaged are formed in this X-direction driving plate fastening part 26.

In addition, slits 28 which extend in the X direction to the vicinity of the side edges 26a are formed in the right end portion of the rectangular attachment hole 22 so that the X-direction driving plate fastening part 26 can be displaced in the Y direction. Furthermore, slits 29 are formed parallel to the slits 28 from both side edges 26a in positions adjacent to the slits 28, and the areas between the slits 28 and 29 constitute elastic deformation parts 30.

The X-direction driving means 40 is structured as shown in FIG. 4.

In particular, the X-direction driving means 40 comprises an X-direction driving plate 41, and a rectangular attachment hole 42 in which another piezo-electric element 43 is installed is formed more or less in the center of the X-direction driving plate 41; and in addition, one end portion 43a of a piezo-electric element 43 which is installed so that the direction of expansion and contraction is oriented in the X direction is fastened to this rectangular attachment hole 42. The right side (in FIG. 4(a)) of the X-direction driving plate 41 constitutes a Y-direction driving plate fastening part 44, and bolt insertion holes 45 into which the bolts 4 are inserted are formed in this Y-direction driving plate fastening part 44. The left side (in FIG. 4(a)) of the X-direction driving plate 41 constitutes a plate spring fastening part 46. Screws 47 with which the bolts 6 are screw-engaged are formed in this plate spring fastening part 46, with two of these screws 47 being in the top surface of the plate spring fastening part 46, and two of the screws 47 being in the side surface of the plate spring fastening part 46.

In addition, slits 48 which extend in the X direction to the vicinity of the side edges 44a are formed in the left and right end portions of the rectangular attachment hole 42 so that the Y-direction driving plate fastening part 44 can be displaced in the X direction. Furthermore, slits 49 which communicate with the end portions of the slits 48 are formed parallel to the side edges 44a, and the areas between the slits 49 and the side edges 44a of the X-direction driving plate 41 constitute elastic deformation parts 50.

Next, the operation of the Y-direction driving means 20 and X-direction driving means 40 will be described. The piezo-electric elements 23 and 43 are connected to a power supply 55.

First, the operation of the Y-direction driving means 20 shown in FIG. 3 will be described.

When voltage is switched on (applied) to the piezo-electric element 23, the piezo-electric element 23 expands. Since the left end portion 23a of the piezo-electric element 23 is fixed, all of the expansion is transmitted to the right end portion 23b. When the right end portion 23b is displaced, the elastic deformation parts 30 undergo elastic deformation so that the X-direction driving plate fastening part 26 is displaced in the −Y direction. Next, when the voltage to the piezo-electric element 23 is switched off (0 V), the piezo-electric element 23 returns to its original length, and the X-direction driving plate fastening part 26 also returns to its original position.

Since the Y-direction driving plate fastening part 44 of the X-direction driving plate 41 is fastened to the X-direction driving plate fastening part 26 of the Y-direction driving plate 21, and since the bonding arm 8 is attached to the plate spring fastening part 46 of the X-direction driving plate 41 via the plate springs 5, when the X-direction driving plate fastening part 26 is moved in the Y direction as described above, the bonding tool 12 is also moved in the Y direction.

Next, the operation of the X-direction driving means 40 shown in FIG. 4 will be described.

When the voltage to the piezo-electric element 43 is switched on, the piezo-electric element 43 expands. Since one end portion 43a of the piezo-electric element 43 is fixed, all of the expansion is transmitted to the other end portion 43b. When the other end portion 43b is displaced, the elastic deformation parts 50 undergo elastic deformation so that the plate spring fastening part 46 is displaced in the +X direction. Next, when the voltage to the piezo-electric element 43 is switched off, the piezo-electric element 43 returns to its original length, and the plate spring fastening part 46 also returns to its original position.

Accordingly, by way of combining the driving or operation of the Y-direction driving means 20 and the driving of the X-direction driving means 40, it is possible to drive the bonding tool 12 in any desired direction parallel to the bonding surface. The timing of the driving of the Y-direction driving means 20 and X-direction driving means 40 is matched with the timing of the bonding shown in FIG. 5.

Figure 5:
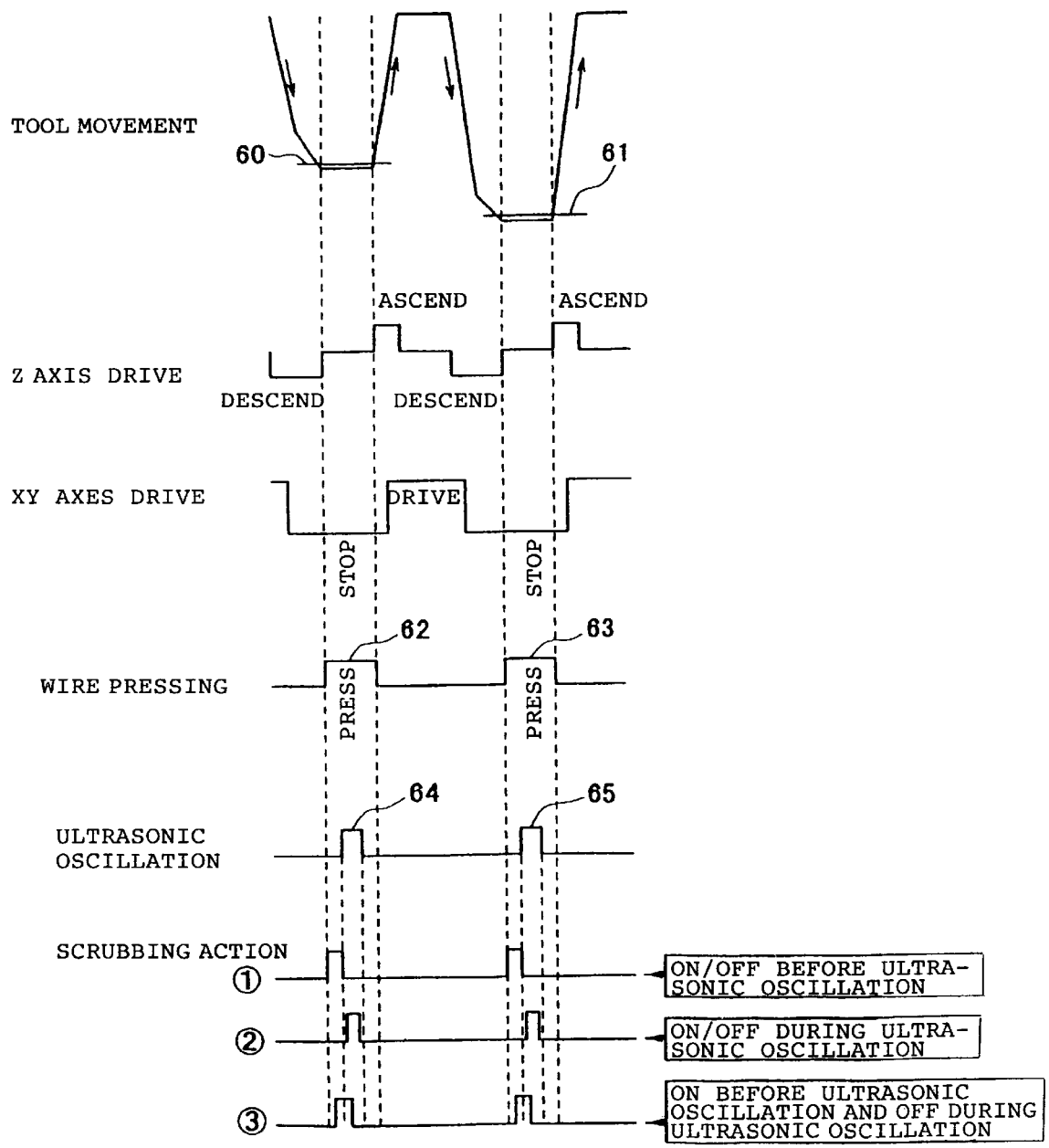
FIG. 5 is a timing chart of the bonding and scrubbing actions.
Figure 6A:
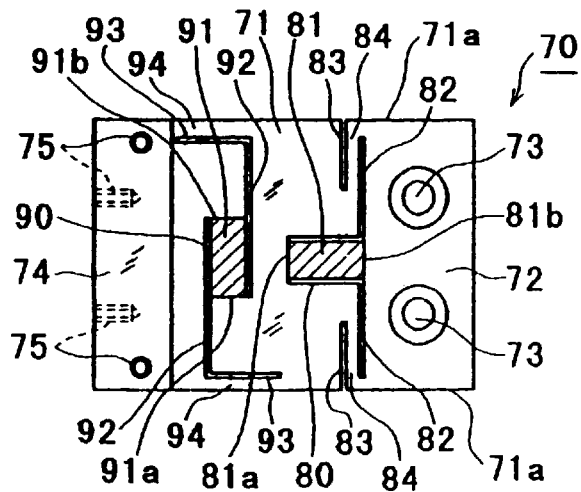
FIG. 6(a) is a plan view of the XY-direction driving means used in the appratus of FIG. 1.
Figure 6A:
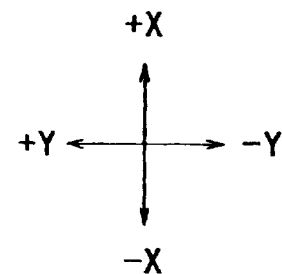
Figure 6B:
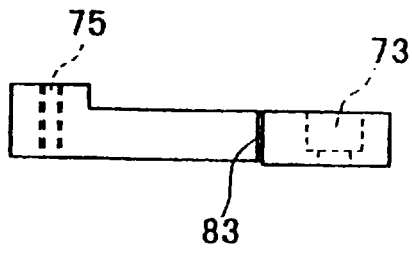
FIG. 6(b) is a side view thereof.
Figure 6B:
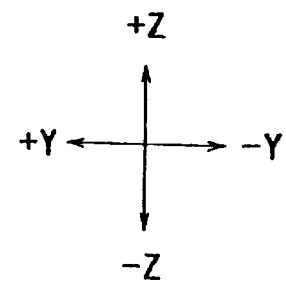

First, the universally known operation except for the scrubbing action will be described with reference to FIG. 5.

As a result of lowering of the bonding tool 12 by driving in the direction of the Z axis by means of a linear motor 14, and planar movement effected by the driving of the XY table 1 in the directions of the X and Y axes, the bonding tool 12 is caused to contact a first bonding surface 60, and the bonding tool 12 is slightly lowered even further from this bonding surface 60 so that a ball (not shown) formed on the tip end of the wire 13 is pressed 62. Following this pressing of the wire, the ultrasonic horn 10 undergoes ultrasonic oscillation 64, so that an ultrasonic vibration is applied to the bonding tool 12. As a result, the ball is bonded to the first bonding surface 60.

Next, the bonding tool 12 is raised, driven in the X and Y directions and lowered; and then the wire 13 is delivered. The bonding tool 12 is brought to contact a second bonding surface 61, and pressing operation 63 of the wire 13 and ultrasonic oscillation 65 are performed in the same manner as in the bonding performed on the first bonding surface 60, so that the wire 13 is bonded to the second bonding surface 61. Afterward, the wire clamper 11 is closed while the bonding tool 12 is being raised so that the wire 13 is cut from the root portion of the second bonding surface 61.

In the above embodiment, a scrubbing action is performed by switching the voltage to the piezo-electric element 23 or 43, or to both of the piezo-electric elements 23 and 43, ON and OFF during the pressing operations 62 and 63. In this scrubbing action, the timing that is optimal for the workpiece involved can be selected. For example, the piezo-electric elements 23 and 43 may be switched ON and OFF prior to the ultrasonic oscillation operations 64 and 65 as shown in FIG. 5(1). Alternatively, the piezo-electric elements 23 and 43 may be switched ON and OFF during the ultrasonic oscillation operations 64 and 65 as shown in FIG. 5(2), or the piezo-electric elements 23 and 43 may be switched on prior to the ultrasonic oscillation operations 64 and 65; and then switched off during the ultrasonic oscillation operations 64 and 65, as shown in FIG. 5(3).

Thus, since the ultrasonic oscillation operations 64 and 65 and the scrubbing action effected by means of the piezo-electric elements 23 and 43 can be performed simultaneously, the combination of timing of such can be freely selected. As a result, the timing of the scrubbing action that is optimal for the workpiece involved can be selected. Furthermore, a scrubbing action can be performed in any desired direction with respect to the first bonding surface 60 and second bonding surface 61 by appropriately combining the on-off switching of the voltage to the piezo-electric element 23 and the on-off switching of the voltage to the piezo-electric element 43. As a result, the direction of the scrubbing action that is optimal for the workpiece involved can be freely selected.

Furthermore, in the embodiment described above, the X-direction driving means 40 is provided on the Y-direction driving means 20. Instead, the Y-direction driving means 20 is provided on the X-direction driving means 40.

FIG. 6 illustrates another embodiment of the present invention. In the embodiment described above, the Y-direction driving means 20 and the X-direction driving means 40 are combined. In the embodiment of FIG. 6, on the other hand, the bonding apparatus includes a single XY-direction driving means 70. The embodiment will be described below with reference to FIG. 6.

The XY-direction driving means 70 comprises an XY-direction driving plate 71, and the right side (in FIG. 6) of the XY-direction driving plate 71 constitutes a bonding head fastening part 72, and bolt insertion holes 73 into which bolts 4 are inserted are formed in this bonding head fastening part 72. The left side (in FIG. 6) of the XY-direction driving plate 71 constitutes a plate spring fastening part 74, and screws 75 with which bolts 6 are screw-engaged are formed in this plate spring fastening part 74, with two screws 75 being in the top surface, and two screw 75 being in the side surface.

A rectangular attachment hole 80 in which a piezo-electric element 81 is installed is formed in the XY-direction driving plate 71 so as to be located in the area between the bonding head fastening part 72 and the plate spring fastening part 74, and the left end portion 81a of a piezo-electric element 81 which is provided so that the direction of expansion and contraction is oriented in the Y direction is fastened to this rectangular attachment hole 80. Furthermore, slits 82 which extend in the X direction to the vicinity of the side edges 71a are formed in the right end portion of the rectangular attachment hole 80 so that the plate spring fastening part 74 can be displaced in the Y direction. Moreover, slits 83 are formed parallel to the slits 82 from both side edges 71a in positions adjacent to the slits 82, and the areas between the slits 82 and 83 constitute elastic deformation parts 84.

A rectangular attachment hole 90 in which a piezo-electric element 91 is installed is formed in the XY-direction driving plate 71 so as to be located in the area between the bonding head fastening part 72 and the plate spring fastening part 74, and one end portion 91a of a piezo-electric element 91 which is installed so that the direction of expansion and contraction is oriented in the X direction is fastened to this rectangular attachment hole 90. Furthermore, slits 92 which extend in the X direction to the vicinity of the side edges 71a are formed in the left and right end portions of the rectangular attachment hole 90 so that the plate spring fastening part 74 can be displaced in the X direction. Moreover, slits 93 which extend in the Y direction and communicate with the end portions of the slits 92 are formed parallel to the side edges 71a, and the areas between the slits 93 and the side edges 71a constitute elastic deformation parts 94.

The thus structured XY-direction driving means 70 is mounted on the bonding head 2 (see FIG. 1). In this case, a block (not shown) that has substantially the same size as that of the Y-direction driving means 20 is used so that the block is fixed to the bonding head 2 by bolts 3 and then the XY-direction driving means 70 is fixed to this block by bolts 4. The remaining constituent elements are the same as in the embodiment described previously.

Next, the operation of the embodiment shown in FIG. 6 will be described.

When the voltage to the piezo-electric element 81 is switched on, the piezo-electric element 81 expands in the Y direction. Since the left end portion 81*a* of the piezo-electric element 81 is fixed, all of this expansion is transmitted to the other end portion 81*b*. When the other end portion 81*b* is displaced, the elastic deformation parts 84 undergo elastic deformation so that the plate spring fastening part 74 is displaced in the +Y direction. Next, when the voltage to the piezo-electric element 81 is switched off, the piezo-electric element 81 returns to its original length, and the plate spring fastening part 74 also returns to its original position.

When the voltage to the piezo-electric element 91 is switched on, the piezo-electric element 91 expands in the X direction. Since one end portion 91*a* of the piezo-electric element 91 is fixed, all of this expansion is transmitted to the other end portion 91*b*. When the other end portion 91*b* is displaced, the elastic deformation parts 94 undergo elastic deformation, so that the plate spring fastening part 74 is displaced in the +X direction. Next, when the voltage to the piezo-electric element 91 is switched off, the piezo-electric element 91 returns to its original length, and the plate spring fastening part 74 also returns to its original position.

As described above, when the plate spring fastening part 74 is moved in the Y direction, the bonding tool 12 is also moved in the Y direction; and when the plate spring fastening part 74 is moved in the X direction, the bonding tool 12 is also moved in the X direction. Accordingly, by combining the driving of the piezo-electric element 81 and the driving of the piezo-electric element 91, the bonding tool 12 can be driven in any desired direction parallel to the bonding surface, so that an effect similar to that of the embodiment described previously can be obtained.

In the respective embodiment described above, the bonding arm 8 is provided on the X-direction driving means 40 or the XY-direction driving means 70 with the plate springs 5 in between; however, it is also possible to provide the bonding arm 8 on the X-direction driving means 40 or XY-direction driving means 70 in a swingable fashion via a supporting shaft.

As seen from the above, in the present invention, a plurality of piezo-electric elements are employed so as to respectively cause the bonding tool to vibrate in any desired direction on the bonding plane during bonding. Accordingly, the vibration of the scrubbing action can be reduced, and a stable bonding operation can be performed. In addition, the timing and direction of the scrubbing action most suitable for the workpiece involved can be freely selected.

What is claimed is:

1. A wire bonding apparatus equipped with a single ultrasonic horn which has a bonding tool attached to one end thereof, wherein a plurality of piezoelectric elements are provided which respectively cause said bonding tool to vibrate in arbitrary directions on a bonding plane during bonding and a low frequency signal and an ultrasonic signal are simultaneously applied to said plurality of piezoelectric elements whereby during contact with said bonding tool, a bonding surface is scrubbed by said low frequency signal and a bonding wire is bonded to said bonding surface by said ultrasonic signal.

2. The wire bonding apparatus according to claim 1, wherein said piezo-electric elements comprise a Y-direction piezo-electric element, which causes said bonding tool to vibrate in a Y-direction parallel to an axis of said ultrasonic horn, and an X-direction piezo-electric element, which causes said bonding tool to vibrate in an X-direction which is on a plane perpendicular to said Y direction.

3. A wire bonding apparatus equipped with a single ultrasonic horn which has a bonding tool attached to one end thereof, wherein said bonding apparatus is further comprised of a Y-direction driving means, which has a Y-direction piezoelectric element that causes said bonding tool to vibrate in a Y-direction parallel to an axis of said ultrasonic horn, and an X-direction driving means, which has an X-direction piezoelectric element that causes said bonding tool to vibrate in an X-direction which is on a horizontal plane perpendicular to said Y-direction, and wherein said piezoelectric elements are driven during bonding so that said bonding tool is caused to vibrate in X- and Y-directions of a bonding plane and a low frequency driving signal and an ultrasonic driving signal are simultaneously applied to said X- and Y-direction piezoelectric elements whereby during contact with said bonding tool, a bonding surface is scrubbed by said low frequency driving signal and a bonding wire is bonded to said bonding surface by said ultrasonic driving signal.

4. A wire bonding apparatus equipped with a single ultrasonic horn which has a bonding tool attached to one end thereof, wherein said bonding apparatus is further comprised of an XY-direction driving means that includes a Y-direction piezoelectric element, which causes said bonding tool to vibrate in a Y direction parallel to an axis of said single ultrasonic horn, and an X-direction piezoelectric element, which causes said bonding tool to vibrate in an X direction which is a horizontal plane perpendicular to said Y direction, and wherein said piezoelectric elements are driven during bonding so that said bonding tool is caused to vibrate in X- and Y-directions of a bonding plane and a low frequency driving signal and an ultrasonic driving signal are simultaneously applied to said X- and Y-direction piezoelectric elements whereby during contact with said bonding tool, a bonding surface is scrubbed by said low-frequency driving signal and a bonding wire is bonded to said bonding surface by said ultrasonic driving signal.

* * * * *